United States Patent
Hayashi et al.

(10) Patent No.: US 6,670,636 B2
(45) Date of Patent: Dec. 30, 2003

(54) SUBSTRATE DEVICE, METHOD OF MANUFACTURING THE SAME, AND ELECTRO-OPTICAL DEVICE

(75) Inventors: Tomohiko Hayashi, Chino (JP); Kiyotaka Koide, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 45 days.

(21) Appl. No.: 09/878,429

(22) Filed: Jun. 12, 2001

(65) Prior Publication Data

US 2002/0008239 A1 Jan. 24, 2002

(30) Foreign Application Priority Data

Jun. 15, 2000 (JP) .......... 2000-179902
Apr. 23, 2001 (JP) .......... 2001-124568

(51) Int. Cl.$^7$ .......... H01L 29/04; H01L 31/036; H01L 31/0376; H01L 31/20; H01L 27/01
(52) U.S. Cl. .......... 257/59; 257/72; 257/350
(58) Field of Search .......... 257/59, 72, 350

(56) References Cited

U.S. PATENT DOCUMENTS

| | | | | |
|---|---|---|---|---|
| 5,663,077 A | * | 9/1997 | Adachi et al. | 438/151 |
| 6,294,799 B1 | * | 9/2001 | Yamazaki et al. | 257/72 |
| 6,365,935 B1 | * | 4/2002 | Zhang et al. | 257/347 |
| 6,376,862 B1 | * | 4/2002 | Yamazaki | 257/64 |
| 6,396,105 B1 | * | 5/2002 | Yamazaki et al. | 257/350 |
| 6,399,988 B1 | * | 6/2002 | Yamazaki | 257/344 |
| 6,441,433 B1 | * | 8/2002 | En et al. | 257/344 |
| 6,445,059 B1 | * | 9/2002 | Yamazaki | 257/642 |
| 6,458,637 B1 | * | 10/2002 | Yamazaki et al. | 438/151 |

FOREIGN PATENT DOCUMENTS

| | | |
|---|---|---|
| JP | A 7-30113 | 1/1995 |
| JP | A 7-176743 | 7/1995 |
| JP | A 8-330584 | 12/1996 |
| JP | A 9-69631 | 3/1997 |
| JP | A 10-321862 | 12/1998 |
| JP | A 11-204787 | 7/1999 |

* cited by examiner

Primary Examiner—Ngân V. Ngô
(74) Attorney, Agent, or Firm—Oliff & Berridge, PLC

(57) ABSTRACT

A semiconductor layer, including a source region, a channel region, and a drain region, is formed on a substrate, and a gate insulation film, formed of a silicon oxide film, is formed on the semiconductor layer. Subsequently, nitrogen atoms are introduced into the gate insulation film so that the nitrogen atoms exist in at least one of the silicon oxide film and an interface between the silicon oxide film and the semiconductor layer. Thereafter, a gate electrode film is formed on the gate insulation film. With this arrangement, good transistor characteristics can be maintained for a long period of time in a substrate device on which a TFT is formed, and further it is difficult for the substrate device to be affected by an environment in which it is used, such as by humidity, temperature, and the like.

7 Claims, 9 Drawing Sheets

SUBSTRATE DEVICE, METHOD OF MANUFACTURING THE SAME, AND ELECTRO-OPTICAL DEVICE

BACKGROUND OF THE INVENTION

1. Field of Invention

The present invention relates to the technical filed of a substrate device, such as a TFT array substrate device, and a semiconductor substrate device on which thin film transistors (hereinafter, referred to as TFTs) are formed. More particularly, the present invention relates to the technical filed of a substrate device that is appropriately provided with an electro-optical device, such as a liquid crystal device.

2. Description of Related Art

Substrate devices of this type include, for example, a polysilicon film having a source region, a drain region and a channel region, or a semiconductor film, such as amorphous silicon formed on a substrate, such as a quartz substrate. A thermally-oxidized film or the like made by dry oxidation or wet oxidation is formed on the surface of the semiconductor film, or a gate insulation film is formed thereon from an HTO film, a TEOS film, or a plasma oxidation film. Further, a TFT is constructed on the substrate by forming a gate electrode film on the gate insulation film. The TFT is used as a pixel switching element in a TFT array substrate device by being built in each pixel in the image display region of an electro-optical device, such as a liquid crystal device. Otherwise, the TFT also is used as a part of the drive circuit of the substrate device by being built in a peripheral region in the circumference of the image display region.

The substrate device, in which the TFT is built as described above, has been widely used in various types of electro-optical devices, including a liquid crystal device employing a TFT active matrix drive system, and the like.

SUMMARY OF THE INVENTION

However, according to a study performed by the inventors of this application, it has been found that when the above-mentioned substrate device is operated for, for example, about 5000 hours, transistor characteristics are deteriorated. More specifically, even if a TFT built in the substrate device exhibits excellent transistor characteristics at the beginning of manufacture of the substrate device, a threshold voltage in the TFT increases in a lifetime of, for example, the 5000 hours which are required in an ordinary product life, and the TFT does not function as a switching element with an ordinary drive voltage, or an off current (that is, a leak current) increases in the TFT and a prescribed duty ratio cannot be sufficiently handled. When the transistor characteristics are deteriorated as described above, a problem arises in that the life of an electro-optical device, which is finally constructed by including, for example, the substrate device, is reduced because the quality of an image, such as a contrast ratio and brightness in the electro-optical device, is lowered. In particular, it also has been found that when various electro-optical devices, including the substrate device, are used in very humid regions, such as South East Asia, and when strong light beams are projected to the substrate device through a light bulb of a projector, the characteristics of a TFT are liable to be more deteriorated because the TFT is affected by high humidity and high temperature. That is, the substrate device has a problem, which is serious to manufacturers in practical applications, in that the life of the device cannot be definitely determined by the affect of the environment in which the device is used, such as humidity and temperature.

An object of the present invention, which was made in view of the above problems, is to provide a substrate device, which includes a TFT, capable of maintaining excellent transistor characteristics for a long period and which is difficult to be affected by an environment in which it is used, such as humidity and temperature and the life of which can be relatively easily increased. It is also an object of the present invention to provide a method of manufacturing the substrate device, as well as to provide an electro-optical device including the substrate device.

To solve the above problems, a substrate device of the present invention includes a substrate, a semiconductor layer formed on the substrate and having a source region, a channel region, and a drain region, a gate insulation film formed on the semiconductor layer in at least the channel region, and a gate electrode film formed on the gate insulation film. The gate insulation film includes a silicon oxide film. Nitrogen atoms exist in at least one of the silicon oxide film and an interface between the silicon oxide film and the semiconductor layer.

According to the substrate device of the present invention, a TFT is constructed by laminating the semiconductor layer, including the channel region and the like, the gate insulation film, and the gate electrode film on the substrate. Here, nitrogen atoms particularly exist in at least one of the silicon oxide film constituting the gate insulation film and the interface between it and the semiconductor layer. As a result, the time-varying deterioration of transistor characteristics, in particular, the deterioration of the transistor characteristics when a transistor is used in an environment of high humidity, high temperature, and the like, can be reduced as compared with a conventional substrate device in which no nitrogen atom exists. With this arrangement, the life of the substrate device can be increased by the provision of the TFT the performance, which can be stably maintained for a long period of time regardless of an environment in which the TFT is used.

Reasons why the deterioration of the transistor characteristics can be lowered in the substrate device of the present invention will be explained below.

First, according to the study of the inventors of this application, when a conventional substrate device, using a dry oxidation film as a gate insulation film, is continuously operated in an ordinary manner, a phenomenon has been confirmed that the threshold value Vth of a gate voltage for turning on a TFT is dislocated toward an enhancement side regardless of whether the TFT is a p-channel TFT or an n-channel TFT. In a substrate device, which includes a power supply circuit capable of supplying a gate voltage up to a predetermined voltage to the TFT, when the threshold value Vth exceeds the predetermined voltage due to the dislocation, it is impossible to operate the substrate device. The phenomenon of dislocation of the threshold value Vth is conspicuous particularly in the p-channel TFT. First, it is contemplated that the transistor characteristics are deteriorated by that the hydrogen atoms in the interface between a gate insulation film and a semiconductor layer are separated therefrom by the heat generated by a channel resistance when a TFT is in operation (for example, the temperature of the transistor increases to about 400° C. in the vicinity of a drain region) and the degree of movement of the nitrogen atoms is lowered in the transistor characteristics. Second, a hot carrier implantation phenomenon (that is, a channel hot electron implantation phenomenon and a drain avalanche hot carrier implantation phenomenon) is contemplated as a cause of the deterioration. Third, it is contemplated that the deterioration is caused by water entering the gate insulation film while the substrate device is being manufactured, or after it has been manufactured, and $H_2O$ molecules disperse to the vicinity of the interface between the gate insulation film and the semiconductor layer so as to generate a positive charge.

When the gate insulation film is formed of the silicon oxide film, as in the substrate device of the present invention, if oxygen enters between single crystal silicons, they are expanded and Si—Si bonding and deformed Si—O—Si bonding are generated and act as hole traps. In contrast, when water (hydrogen atoms) enters the vicinity of the interface between the gate insulation film and the semiconductor layer, Si—H bonding is generated and acts as a positive charge of $Si^+$. Further, when water (oxygen atoms and hydrogen atoms) enters the vicinity of the interface, Si—OH bonding is generated and acts as an electron trap center so as to increase an interface level. As described above, it is contemplated that the generation of the hole traps and the positive charge as well as the increase in the interface level are a main factor of the dislocation of the above-mentioned threshold value Vth.

To address this problem, in the substrate device of the present invention, the generation of the hole trap, the positive charge and negative charge in the interface as well as the increase in the interface level, which are the main factor of the above-mentioned dislocation of the threshold value Vth, are reduced by existing nitrogen atoms in the interface between the gate insulation film and the semiconductor layer and in the vicinity of the interface.

Further, in the substrate device of the present invention, a moisture resistance is enhanced by mixedly existing nitride film bonding by the existence of the nitrogen atoms in the interface between the gate insulation film and the semiconductor layer and in the vicinity of the interface. With this arrangement, the amount of water entering the interface between the gate insulation film and the semiconductor layer and the vicinity thereof can be reduced as well as the generation of the positive charge and the increase in the interface level can be reduced by reducing the generation of the above-mentioned Si—H bonding and Si—OH bonding.

In addition to the above, in the substrate device of the present invention, the existence of the nitrogen atoms in the interface between gate insulation film and the semiconductor layer and the vicinity of the interface permits nitrogen atoms to enter a network of atoms in this region. This arrangement can ease the deformation of the interface and further reinforces a weak bonding portion. In particular, since it is contemplated that the relatively high bonding energy of Si—O is reduced by deforming a bonding state, the Si—Si bonding and the deformed Si—O—Si bonding, Si—H bonding, and Si—OH bonding can be reduced by the existence of the nitrogen atoms. As a result, the interface level and the trap center of an oxide film can be presented from being formed by a hot carrier.

In one aspect of the substrate device of the present invention, the semiconductor layer is formed of any of low temperature polysilicon, high temperature polysilicon, single crystal silicon, and amorphous silicon.

According to this aspect, any of a low temperature polysilicon TFT, a high temperature polysilicon TFT, a single crystal silicon TFT, and an amorphous silicon TFT is constructed on a substrate. However, the transistor characteristics of this TFT can be effectively prevented from being deteriorated by existing nitrogen atoms in the interface between any of a polysilicon film, a single crystal silicon film, and an amorphous silicon film and a silicon oxide film and in the vicinity of the interface, whereby the life of a substrate device including the polysilicon TFT, the single crystal silicon TFT, or the amorphous silicon TFT can be increased.

In another aspect of the substrate device of the present invention, the above gate insulation film is formed of any of a thermally-oxidized film, a HTO film, a TEOS film, and a plasma-oxidized film.

According to this aspect, a gate insulation film can relatively easily form an insulating film of relatively good quality. Further, the deterioration of the transistor characteristics of the TFT can be effectively prevented by existing the nitrogen atoms in the interface between the semiconductor layer and the silicon oxide film and the vicinity of the interface, whereby the life of the substrate device can be increased.

In another aspect of the substrate device of the present invention, the substrate is formed of a quartz substrate.

According to this aspect, a TFT, in which the transistor characteristics thereof are particularly excellent and the deterioration of the transistor characteristics is lowered, can be constructed on the quartz substrate, whereby a substrate device having a high performance can be realized.

In another aspect of the present invention, the nitrogen atoms exist in both of the silicon oxide film and the interface, and have a peak of concentration in the vicinity of the interface.

According to this aspect, the nitrogen atoms are caused to exist so as to have the peak of concentration in the interface between the semiconductor layer and the gate insulation film, and in the vicinity of the interface where the hole traps and the positive charge are greatly generated and where the interface level is greatly increased. The hole trap, positive charge and interface level are contemplated as the main factor of the above-mentioned dislocation of the threshold value Vth. As a result, the generation of the hole traps and the positive charge and the increase in the interface level can be very effectively reduced by the existence of the nitrogen atoms, which permits the deterioration of the transistor characteristics to be effectively lowered.

In another aspect of the substrate device of the present invention, a plurality of rows of thin film transistors, each formed of the semiconductor layer, the gate insulation film, and the gate electrode film, are disposed on the substrate in an array shape.

According to this aspect, a TFT array substrate device can be constructed which is preferably used in an electro-optical device, for example, a liquid crystal device of a TFT active matrix derive system, and the like.

To solve the above problems, a method of manufacturing the substrate device (including the various aspects thereof) of the present invention includes a step of forming the semiconductor layer on the substrate, a step of forming the gate insulation film on the semiconductor layer, a step of introducing, after the gate insulation film is formed, the nitrogen atoms in the gate insulation film, and a step of forming, after the nitrogen atoms are introduced, the gate electrode film on the gate insulation film.

According to the method of manufacturing the substrate device of the present invention, first, the semiconductor layer is formed on the substrate and the gate insulation film is formed on the semiconductor layer. Thereafter, the nitrogen atoms are introduced in the gate insulation film. Accordingly, the structure, in which the nitrogen atoms exist in at least one of the silicon oxide film constituting the gate insulation film and the interface between the silicon oxide film and the semiconductor layer, can relatively easily be obtained using an existing diffusion technology, implantation technology and plasma technology. Thereafter, a TFT is constructed on the substrate by forming the gate electrode film on the gate insulation film.

In an aspect of the method of manufacturing the substrate device of the present invention, the step of introducing the nitrogen atoms includes a step of executing annealing in a gas atmosphere containing the nitrogen atoms.

According to this aspect, when the gate oxide film is formed using an existing furnace (diffusion furnace) or the like, the step of forming the gate oxide film in the gas atmosphere containing the nitrogen atoms or the step of introducing the nitrogen atoms by executing annealing in the gas atmosphere containing the nitrogen atoms can be relatively simply executed.

In this aspect, the above gas may contain at least one of $N_2O$ (dinitrogen oxide) gas, NO (nitrogen oxide) gas, and $NH_4$ (ammonia) gas.

When the substrate device is manufactured as described above, nitrogen atoms can relatively easily be introduced in the interface between the gate insulation film and the semiconductor layer and in the vicinity of the interface at a low cost.

In another aspect of the method of manufacturing the substrate device of the present invention, the step of introducing the nitrogen atoms includes a step of executing a plasma technology, lamp annealing, laser annealing or ion implantation.

According to this aspect, nitrogen atoms can be introduced in the interface between the gate insulation film and the semiconductor layer and in the vicinity of the interface by the existing plasma technology, lamp annealing, laser annealing (excimer laser annealing) or ion implantation.

The electro-optical device of the present invention includes the above-mentioned substrate device (including the various aspects thereof) to solve the above problems.

Since the electro-optical device of the present invention includes the above-mentioned substrate device of the present invention, a substrate device is realized which has a long life and which can maintain a stable performance for a long period of time regardless of an environment in which it is used.

The above operation and other advantages of the present invention will be apparent from the embodiment which will be described below.

DETAILED DESCRIPTION OF PREFERRED EMBODIMENTS

Typical embodiments of the present invention will be described below with reference to the accompanying drawings.

(First Typical Embodiment of a Substrate Device)

Figure 1:
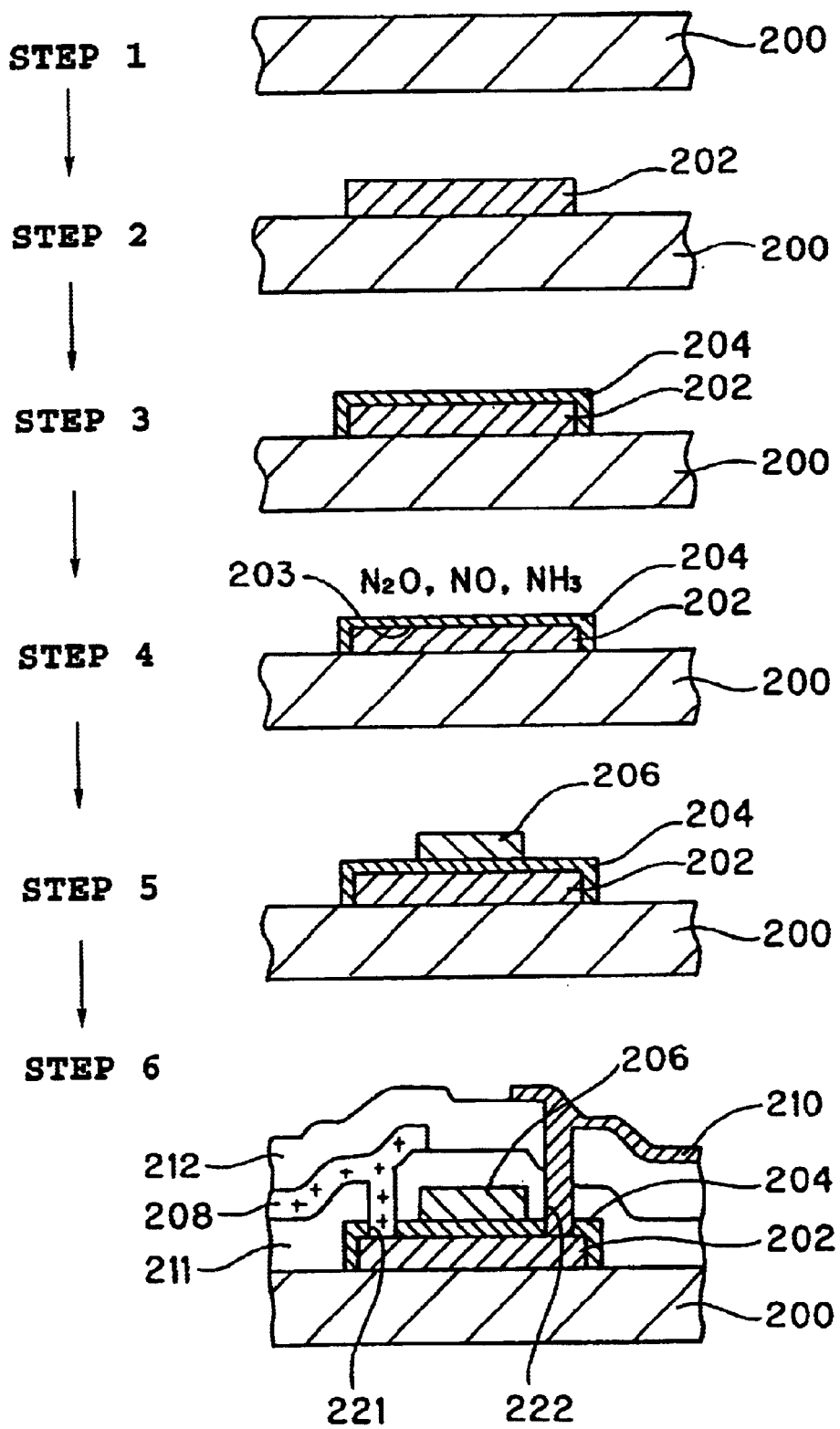
FIG. 1 is a schematic showing sequential steps of a typical manufacturing method of a substrate device in accordance with a first embodiment of the present invention.
Figure 2:
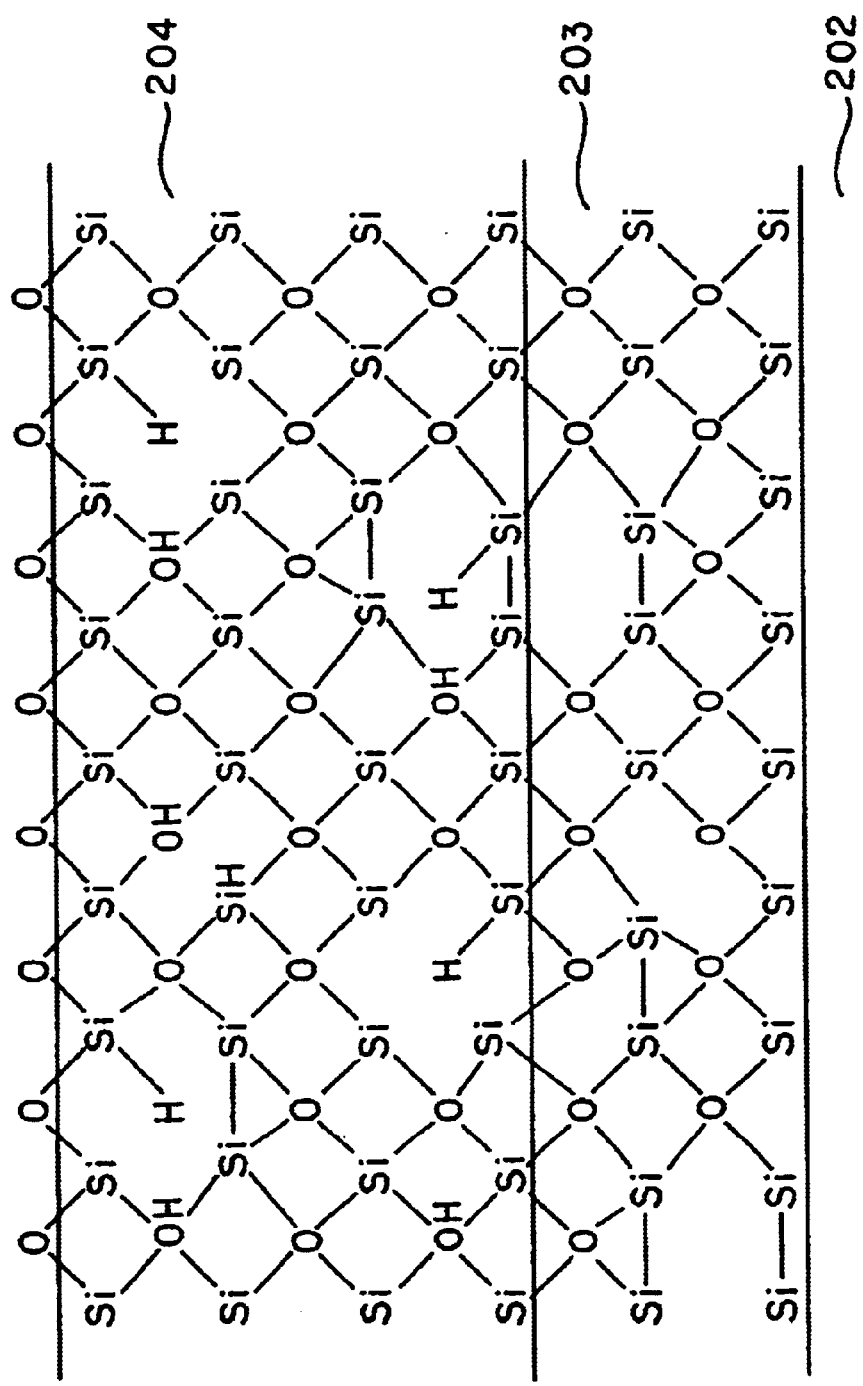
FIG. 2 is a schematic showing a crystal structure in the vicinity of an interface between a semiconductor layer and a gate insulation film in step (3) of FIG. 1.
Figure 3:
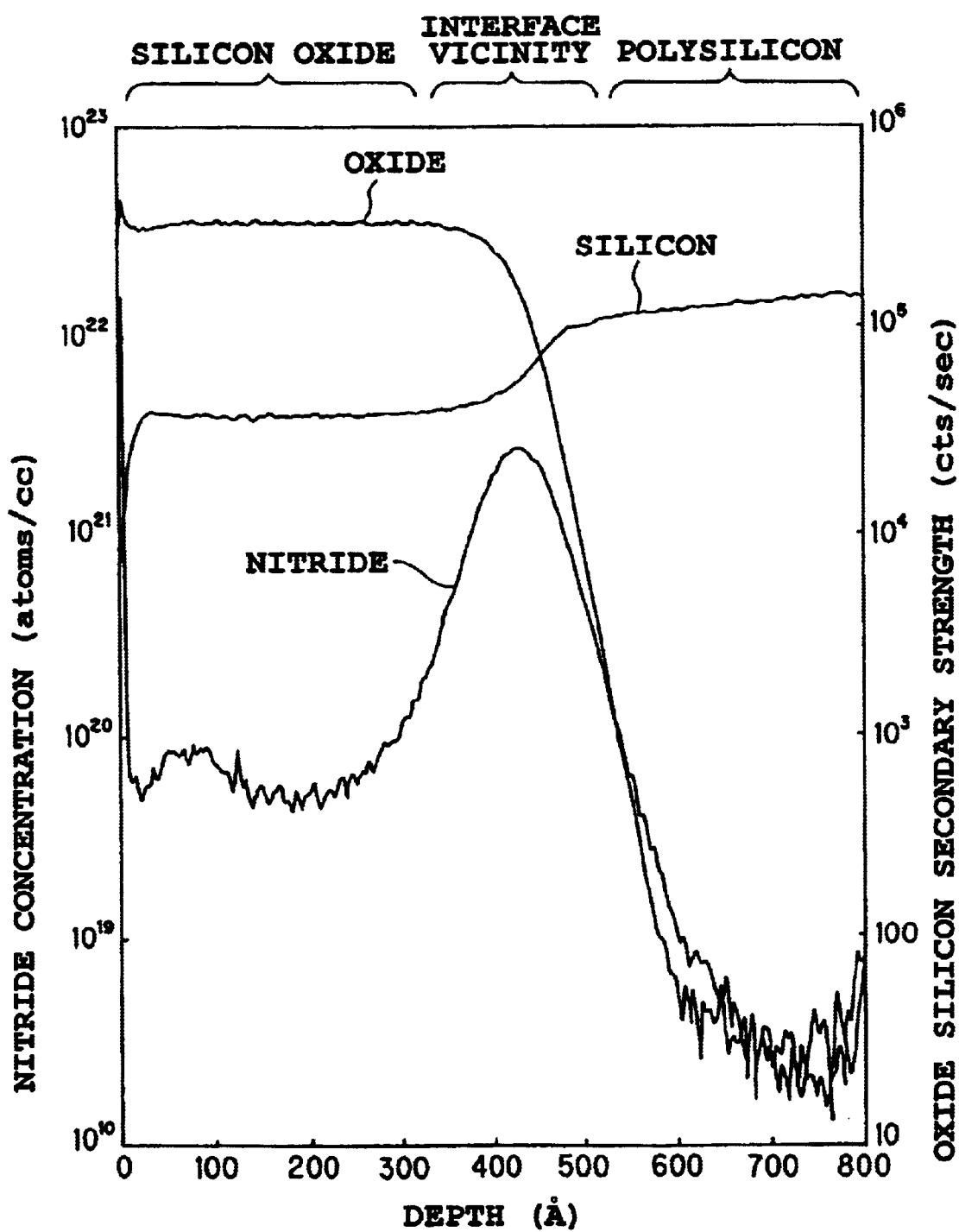
FIG. 3 is a characteristic graph showing the density of nitrogen introduced in step (4) of FIG. 1 and the secondary strengths of oxygen and silicon in the portion from the gate insulation film to the semiconductor layer with respect to the depth from the surface of the gate insulation film.

First, a manufacturing method and an arrangement of a substrate device of a first embodiment will be described with reference to FIGS. 1 to 3. FIG. 1 is a schematic showing sequential steps of the manufacturing method of a first embodiment, and shows a sectional structure of the substrate device in the vicinity of a TFT in each step. FIG. 2 is a schematic showing a crystal structure in the vicinity of an interface between a semiconductor layer (polysilicon film) and a gate insulation film (thermally-oxidized film) in a step (3) of FIG. 1. FIG. 3 is a characteristic graph showing the secondary strengths of oxygen and silicon in the portion from the gate insulation film to semiconductor layer and the density of nitrogen introduced in a step (4) of FIG. 1 with respect to the depth from the surface of the gate insulation film.

In FIG. 1, a quartz substrate 200 is prepared in step (1), and, in step (2), after a polysilicon film is formed on the quartz substrate 200, a polysilicon film 202 as a semiconductor layer, having a predetermined pattern and including the source region, channel region and drain region of a TFT, is formed by photolithography and etching. This polysilicon film 202 may be a low temperature polysilicon film, a high temperature polysilicon film, a single crystal silicon or an amorphous silicon. Further, a plastic substrate, a glass substrate or the like, may be used in place of the quartz substrate 200.

Next, in step (3), a thermally-oxidized silicon film 204 is formed as a gate insulation film on the surface of the polysilicon film 202 by dry oxidation or wet oxidation.

In the state of step (3), when oxygen enters between the single crystal silicons constituting the polysilicon film 202, the polysilicon film 202 is expanded and Si—Si bonding and deformed Si—O—Si bonding are generated and act as hole traps as shown in FIG. 2. In contrast, when water (H₂O molecules) enters an interface vicinity 203, between the thermally-oxidized silicon film 204 and the polysilicon film 202, SiH bonding is generated and acts as a positive charge of Si⁺. Further, when water enters the interface vicinity 203, Si—OH bonding is generated and acts as an electron trap center so as to increase an interface level.

As described above, in step (3), the generation of the hole traps and the positive charge as well as the increase in the interface level potentially exist as a main factor of the above-mentioned dislocation of the threshold value Vth.

In this embodiment, however, nitrogen atoms are introduced into the thermally-oxidized silicon film 204 and into the interface vicinity 203 between the thermally-oxidized silicon film 204 and the polysilicon film 202 by executing annealing in an atmosphere containing nitrogen atoms in a furnace (diffusion furnace) in step (4). Nitrogen gas, such as N₂O gas, NO gas, NH₄ gas is used as this gas.

A structure, in which nitrogen atoms exist in the thermally-oxidized silicon film 204 and in the interface vicinity 203 between the thermally-oxidized silicon film 204 and the polysilicon film 202, can be relatively easily obtained by introducing nitrogen atoms as described above.

When the the nitrogen atoms are introduced as described above, they are distributed to have a concentration as shown in, for example, the characteristic curve of FIG. 3. That is, the nitrogen atoms have a peak concentration in the interface vicinity 203 as shown in FIG. 3.

Thereafter, in step (5), a gate electrode 206 formed of a conductive polysilicon film or the like is formed on the thermally-oxidized silicon film 204. Further, in step (6), a source electrode wire 208, which is connected to a source region through a contact hole 221, is formed of a metal film, for example, Al (aluminum) on a first interlayer insulation film 221. In contrast, a drain electrode wire 210, which is connected to a drain region through a contact hole 222, is formed of a conductor film, for example, ITO (indium tin oxide) on a second interlayer insulation film 212.

A TFT is formed on the substrate 200 by steps (1) to (5) described above.

In the substrate device of this embodiment, the existence of the nitrogen atoms in the interface vicinity 203 reduces the generation of the hole traps and positive charge in an interface as well as the increase in the interface level which are the main factor of the dislocation of the above-mentioned threshold value Vth. Further, the existence of the nitrogen atoms in the interface vicinity 203 enhances moisture resistance by existing nitride film bonding in mixture. With this arrangement, the amount of water entering the interface vicinity 203 can be reduced as well as the generation of the positive charge and the increase in the interface level can be reduced by reducing the generation of the above-mentioned Si—H bonding and S—OH bonding.

Further, the existence of the nitrogen atoms in the interface vicinity 203 enhances a moisture resistance by causing nitride film bonding to mixedly exist. This arrangement can reduce the amount of water entering the boundary vicinity 203 so that the generation of the positive charge and the increase in the interface level can be reduced by reducing the generation of the above-mentioned Si—H bonding and Si—OH bonding.

In addition to the above, the existence of the nitrogen atoms in the interface vicinity 203 permits nitrogen atoms to enter a network of atoms in this region. This arrangement can ease the deformation of the interface and further reinforce weak bonding portions. Here, the stability of bonding energy has the following relationship of magnitude.

>bonding energy of Si—O (4.8 eV)

>bonding energy of Si—N (3.5 eV)

>bonding energy of Si—H (3.2 eV)

>bonding energy of Si—Si (2.0 eV)

It is contemplated that the bonding energy of Si—O, which is relatively large among the above group, is reduced by a deformed bonding state. Thus, the existence of nitrogen atoms can reduce the Si—Si bonding and the deformed Si—O—Si bonding, Si—H bonding, and Si—OH bonding. The interface level and the center of trap of an oxide film can be prevented from being formed by a hot carrier.

Incidentally, a nitride film (Si₃N₄ film) is superior to an oxide film (SiO₂ film) in a moisture resistance. However, if the gate insulation film is formed of a nitride film in the substrate device of the present invention, the IV characteristic of a TFT is made to a characteristic which cannot be used as a switching element because a Pool-Frenkel current flows thereto. Further, if the gate insulation film is formed of a nitride film, it is very difficult to form a contact hole for making contact with the semiconductor layer by an existing etching technology.

To address this problem, in the substrate device of this embodiment, nitrogen atoms are caused to exist in a silicon oxide film and in an interface between the silicon oxide film and the semiconductor layer while forming the gate insulation film of the silicon oxide film in place of forming it of a nitride film (silicon nitride film) so that nitride rich regions are formed in the silicon oxide film and the interface. With this arrangement, the TFT of the substrate device of this embodiment can be preferably used as a switching element because the IV characteristic of the TFT can be made to an IV characteristic which permits an FN current to flow similarly to a TFT using an ordinary oxide film as a gate insulation film. Further, the contact holes 221 and 222 can be relatively easily formed in step (6) of FIG. 1 with pinpoint accuracy by an existing dry or wet etching technology, because the oxide film can be more easily etched than the nitride film.

As described above, the substrate device of this embodiment is very advantageous in that it can appropriately provide the gate insulation film with the advantage of a nitride film which is excellent in resistance against the deterioration of characteristics without sacrificing the advantage of a conventional thermally-oxidized silicon film in structure and manufacture.

It has been confirmed that an effect of this tendency can be obtained even if a slight amount of nitrogen atoms is added. Further, while it is technically possible to relatively easily introduce the nitrogen atoms in an amount of about 20 wt %, a further effect can be expected by increasing a nitrogen concentration.

Figure 4:
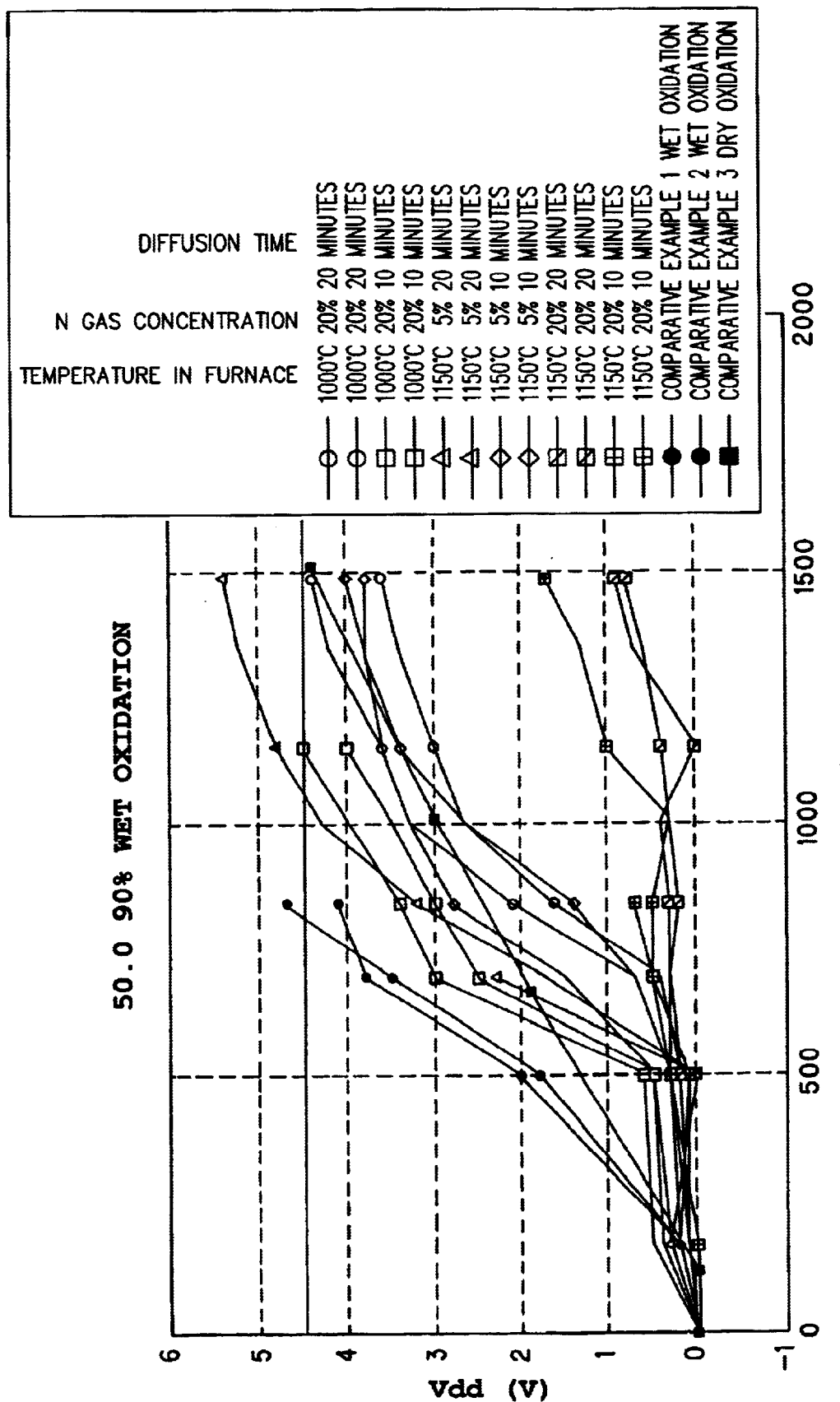
FIG. 4 is a characteristic graph showing the amounts of dislocation Vdd (V) of a threshold value Vth from the initial value thereof with respect to the operating times of a plurality of embodiments, in which an amount of nitrogen atoms introduced is changed, and comparison examples in which no nitrogen atom is introduced.

FIG. 4 shows the amounts of dislocation Vdd (V) of a threshold value Vth from the initial value thereof with respect to the operating times of a plurality of embodiments, in which an amount of nitrogen atoms introduced is changed, and comparison examples in which no nitrogen atom is introduced. FIG. 4 shows the voltages Vdd of the respective embodiments and the comparative examples when the temperature in a furnace was set to 1000° or 1150°, the concentration of N₂O gas in the atmosphere of the furnace was set to 20 or 5 flow percent, and a diffusion time was set to 20 or 10 minutes.

As shown in FIG. 4 as the comparative examples, when the substrate devices are continuously operated in an ordinary method in the substrate devices in which dry and wet oxide films are used as a conventional gate insulation film, the threshold value Vth of a gate voltage for turning on a TFT is dislocated toward an enhancement side, and when about 1000 hours pass, the amount of dislocation Vdd exceeds a voltage which can be coped with by, for example, an increase in a supply voltage in a power supply circuit. In contrast, in the respective embodiments in which the nitrogen atoms are introduced in the interface vicinity 203, the amount of dislocation Vdd is reduced in accordance with an amount of introduction of them. In particular, it can be found that an increase in concentration of nitrogen gas suppresses an increase in the amount of dislocation Vdd.

As described above in detail, according to the substrate device of this embodiment, the time-varying deterioration of transistor characteristics, in particular, the time-varying deterioration of the transistor characteristics when a transistor is used in an environment of high humidity, high temperature, and the like can be reduced. With this arrangement, the life of the substrate device can be increased by the provision of the TFT the performance of which can be stably maintained for a long period of time regardless of an environment in which the TFT is used.

It should be noted that an n-channel or p-channel type TFT may be constructed by changing a type of impurities to be doped in the polysilicon film 202 in accordance with a specification of the substrate device in the embodiment described above. The effect for suppressing the deterioration of the transistor characteristics can be obtained in any type of the TFTs.

Further, this embodiment introduces nitrogen atoms in the interface vicinity 203 by executing annealing in the gas atmosphere containing the nitrogen atoms in the furnace in step (4) of FIG. 1. However, this step may be performed by a plasma technology, lamp annealing, laser annealing, or ion implantation, which are existing technologies.

(Second Typical Embodiment of the Substrate Device)

Figure 5:
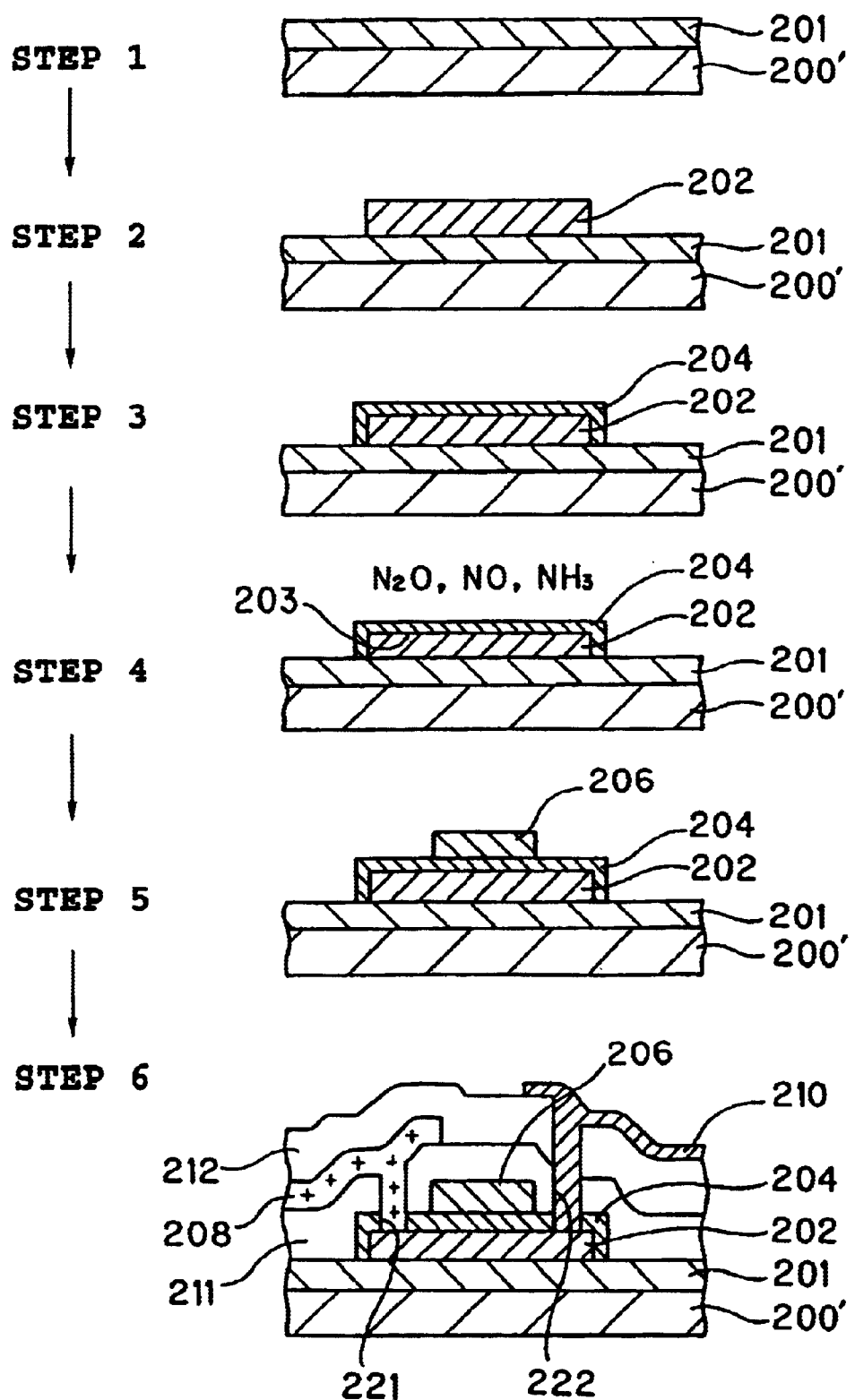
FIG. 5 is a schematic showing sequential steps of the typical manufacturing method of the substrate device in accordance with a second embodiment of the present invention.

Next, a manufacturing method and a structure of the substrate device of a second embodiment of the present invention will be described with reference to FIG. 5. FIG. 5 is a schematic showing sequential steps of the manufacturing method of the second embodiment, and shows a sectional structure in the vicinity of a TFT in each step. Note that, in FIG. 5, the same components as those of the first embodiment shown in FIG. 1 are denoted by the same reference numerals and the description thereof is omitted.

In FIG. 5, a silicon oxide film 201 is formed on the entire surface of a quartz substrate 200 in step (1). Then, in step (2), a polysilicon film 202 as a semiconductor layer is formed on the silicon oxide film 201, and subsequently processes similar to those of the first embodiment are sequentially executed so that a TFT structure is finally constructed on the silicon oxide film 201.

Since nitrogen atoms are introduced in an interface vicinity 203, between the polysilicon film 202 and a thermally-oxidized silicon film 204 in step (4), also in the substrate device of the second embodiment, an effect, which is a unique characteristic of the present invention, can be obtained similarly to the first embodiment.

(Typical Embodiment of an Electro-optical Device)

Next, an embodiment of an electro-optical device having the substrate device of the present invention will be described with reference to FIGS. 6 to 10. This embodiment relates to an electro-optical device provided with the above-mentioned substrate device of any of the first and second embodiments as a TFT array substrate, in which the TFT array substrate and a confronting substrate are disposed in confrontation with each other, and an electro-optical material such as liquid crystal or the like is held therebetween.

Figure 6:
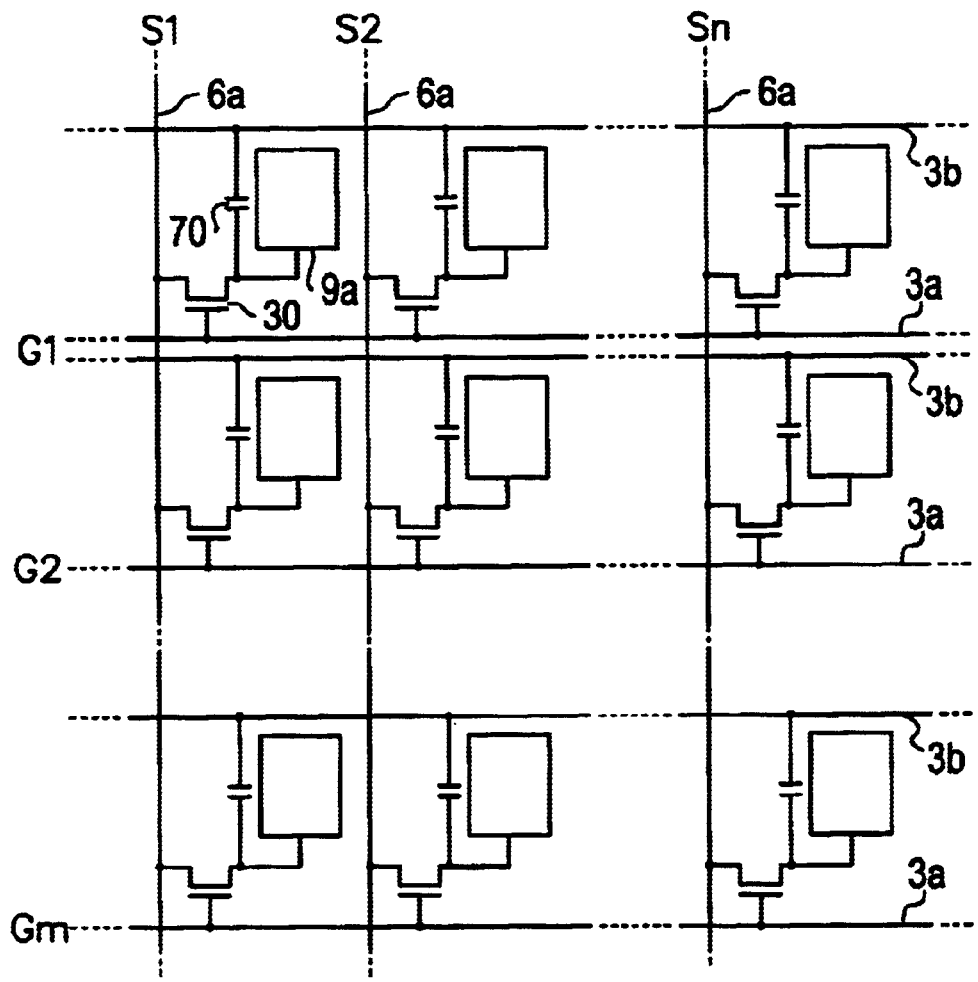
FIG. 6 is a schematic of an equivalent circuit of various elements, wiring, and the like disposed to a plurality of matrix-shaped pixels constituting an image display region in an embodiment of an electro-optical device of the present invention.
Figure 7:
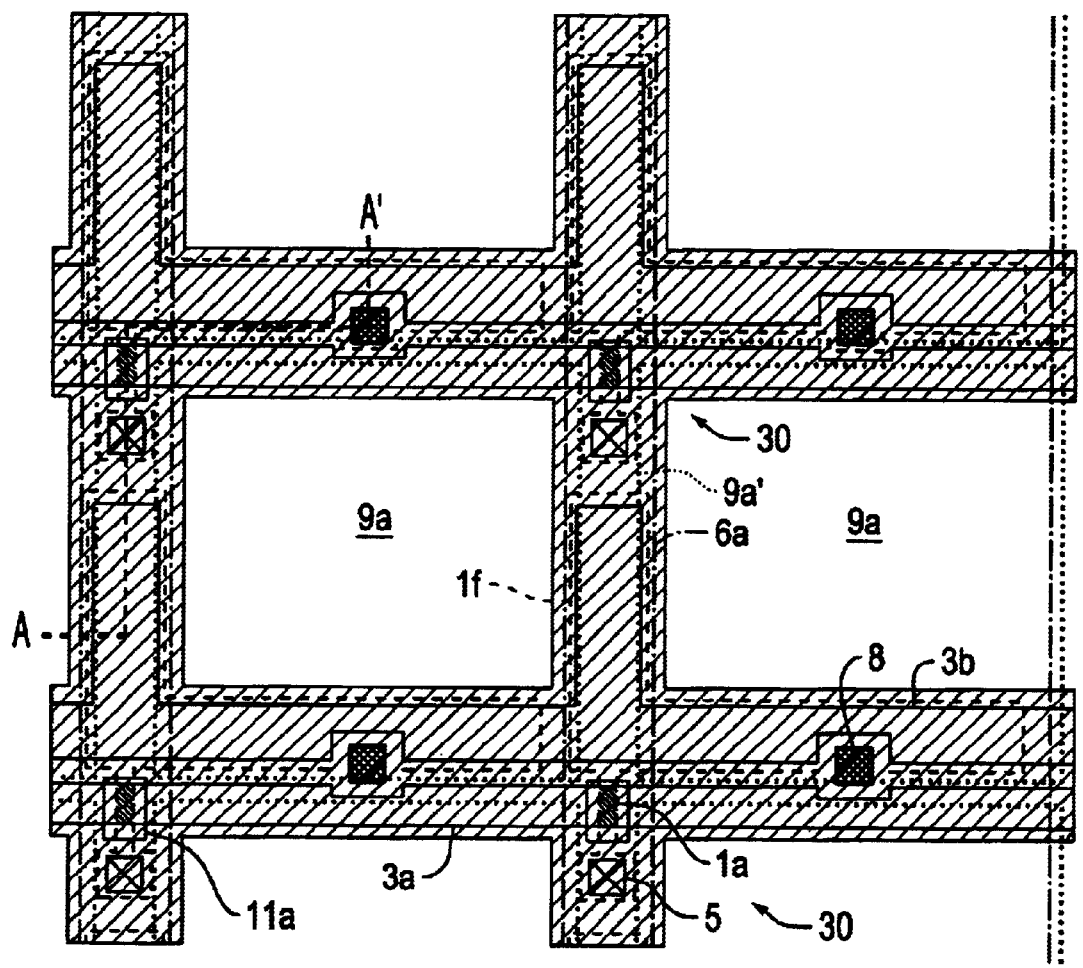
FIG. 7 is a plan view of a plurality of adjacent pixel groups of a TFT array substrate, on which data lines, scanning lines, pixel electrodes, and the like are formed in the electro-optical device of FIG. 6.
Figure 8:
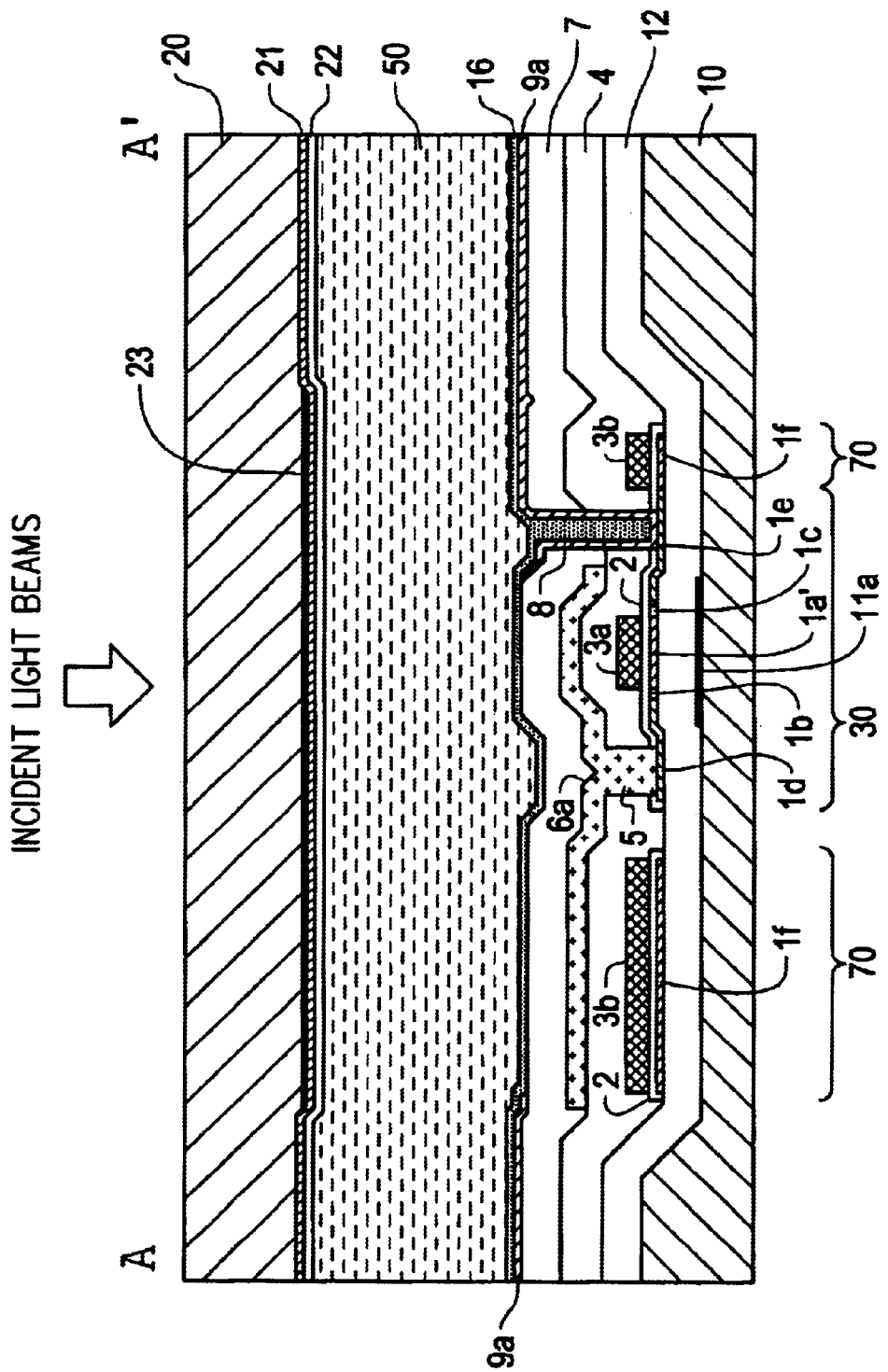
FIG. 8 is a sectional view taken along plane A–A' of FIG. 7.

First, the arrangement of the image display region of the electrooptical device of this embodiment will be described together with its operation with reference to FIGS. 6 to 8. FIG. 6 is an equivalent circuit diagram of various elements, wiring, and the like disposed to a plurality of matrix-shaped pixels constituting the image display region of the electro-optical device. FIG. 7 is a plan view of a plurality of adjacent pixel groups of the TFT array substrate on which data lines, scanning lines, pixel electrodes, and the like are formed, and FIG. 8 is a sectional view taken along plane A–A' of FIG. 7. Note that, in FIG. 8, respective layers and components have a different reduction ratio so that they have a size which is recognizable on the figure.

In FIG. 6, in the electro-optical device of this embodiment particularly including the above-mentioned substrate device of the first or second embodiment as the TFT array substrate, the plurality of pixels formed in the matrix shape to constitute the image display region of the electro-optical device have a plurality of pixel electrodes 9a formed in a matrix shape and a plurality TFTs 30 formed in a matrix shape to control the pixel electrodes 9a, and the data lines 6a to which an image signal is supplied are electrically connected to the sources of the TFTs 30. Further, the scanning lines 3a are electrically connected to the gates of the TFTs 30, and scanning signals G1, G2, . . . , Gm are sequentially applied to the scanning lines 3a as a pulse in this order at predetermined timing. The pixel electrodes 9a are electrically connected to the drains of the TFTs 30, and the image signals S1, S2, . . . Sn supplied from the data lines 6a are written to the electro-optical substance by turning off the TFTs 30 acting as switching elements for a predetermined period of time. The image signals S1, S2, . . . Sn written to the electro-optical substance through the pixel electrodes 9a and having a predetermined level are maintained for a predetermined period between the pixel electrodes 9a and a confronting electrode (to be described later) formed on the confronting substrate (to be described later). The electro-optical substance modulates light beams and permits display of gradation by that the orientation and order of a molecule aggregation are changed based on a level of an applied voltage. Storage capacitors 70 are added in parallel with electro-optical substance capacitors formed between the pixel electrodes 9a and the confronting electrode.

In FIG. 7, in the electro-optical device of this embodiment including particularly the above-mentioned substrate device of the first or second embodiment as the TFT array substrate described above, the plurality of transparent pixel electrodes 9a (the outline of which is shown by dotted line portions 9a') are disposed on the TFT array substrate in the matrix shape, and the data lines 6a, the scanning lines 3a, and capacitance lines 3b are disposed along the longitudinal and lateral interfaces of the pixel electrodes 9a. The data lines 6a are connected to the source regions to be described later of a semiconductor layer 1a formed of a polysilicon film or the like through contact holes 5, and the pixel electrodes 9a are connected to the drain region to be described later of the semiconductor layer 1a through contact holes 8. Further, the scanning lines 3a are disposed so as to confront the channel region (shown by oblique lines inclining downward in the right direction in FIG. 7) of the semiconductor layer 1a and act as gate electrodes. Each capacitance line 3b has a main line portion extending approximately linearly along a scanning line 3a and a projecting portion projecting to a front stage side (in an upward direction in FIG. 7) along a data line 6a from a position where the capacitance line 3b intersects the data line 6a. Further, a first island-shaped shading film 11a is disposed in each island-shaped rectangular region shown by a thick line in FIG. 7 at a position where it covers at least the channel region of each TFT for each pixel when observed from the TFT array substrate side.

Next, as shown in the sectional view of FIG. 8, the electro-optical device includes a transparent TFT array substrate 10 and the transparent confronting substrate 20 disposed in confrontation with the TFT array substrate 10. The TFT array substrate 10 is formed of, for example, a quartz substrate, and the confronting substrate 20 is formed of, for example, a glass substrate or a quartz substrate. The pixel electrodes 9a are disposed on the TFT array substrate 10, and an orientation film 16, which has been subjected to predetermined orientation processing such as rubbing processing or the like, is disposed on the pixel electrodes 9a. The pixel electrodes 9a are formed of a transparent conductive thin film, such as an ITO film (indium tin oxide film). Further, the orientation film 16 is formed of an organic thin film, such as a polyimide thin film. In contrast, the confronting electrode (common electrode) 21 is disposed on the entire surface of the confronting substrate 20, and an orientation film 22, which has been subjected to predetermined orientation processing, such as rubbing processing, is disposed under the confronting electrode 21. As shown in FIG. 8, the pixel switching TFTs 30 are disposed at positions adjacent to the respective pixel electrodes 9a so as to control the switching operation of the respective pixel electrodes 9a. As shown further in FIG. 8, the confronting substrate 20 has second shading films 23 in the regions thereof other than the opening regions of the respective pixels (that is, the regions through which incident light beams actually pass and which effectively contribute to display).

An electro-optical substance layer 50 is formed by inserting the electro-optical substance, such as the liquid crystal, in a space surrounded by a seal member to be described later (refer to FIGS. 9 and 10) between the TFT array substrate 10 and the confronting substrate 20 which are arranged as described above and disposed so that the pixel electrodes 9a face the confronting electrode 21. The electro-optical substance layer 50 is put into a predetermined orientating state by the orientation films 16 and 22 in a state in which no electric field is applied to the electro-optical substance layer 50 from the pixel electrodes 9a. The electro-optical substance layer 50 is formed of an electro-optical substance in which one or a plurality of kinds of nematic liquid crystal, for example, are mixed. The seal member is an adhesive formed of, for example, a photo-curing or thermosetting resin to bond the TFT array substrate 10 to the confronting substrate 20 around the peripheries thereof, and a spacer such as glass fiber, or glass beads is mixed therewith to set the distance between both the substrates to a predetermined value.

In this embodiment shown in FIGS. 7 and 8, the TFT array substrate 10 is recessed in a concave shape in the network-shaped region, in which the oblique lines inclining upward in the right direction are drawn in FIG. 7, and the data lines 6a, the scanning lines 3a, and the capacitance lines 3b as well as the TFTs 30 are included, and grooves for making the image display region flat are formed.

As shown in FIG. 8, the first shading film 11a is disposed at a position where it confronts each image switching TFT 30 in an island state for each pixel between the TFT array substrate 10 and each image switching TFT 30. The first shading film 11a is preferably formed of single metal, alloy, metal silicide, or the like containing at least one of Ti, Cr, W, Ta, Mo, and Pb as opaque high melting point metal.

Further, a first interlayer insulation film 12 is interposed between the first shading films 11a and the plurality of image switching TFTs 30. The first interlayer insulation film 12 is disposed to electrically insulate the semiconductor layer 1a constituting the pixel switching TFTs 30 from the first shading films 11a. Further, the first interlayer insulation film 12, which is formed on the entire surface of the TFT array substrate 10, operates as an underlayer film for the pixel switching TFTs 30.

In this embodiment, the gate insulation film 2 is extended from the positions where it faces the scanning lines 3a and used as a dielectric film, the semiconductor layer 11a is extended and used as a first storage capacitor electrode 1f, and further a part of the capacitance lines 3b facing them are used as second storage capacitor electrode to thereby arrange the storage capacitors 70.

In FIG. 8, each pixel switching TFT 30 has an LDD (lightly doped drain) structure and includes a scanning line 3a, the channel region 1a' of the semiconductor layer 1a to which a channel is formed by an electric field from the scanning line 3a, the gate insulation film 2 for insulating the scanning line 3a and the semiconductor layer 1a, a data line 6a, the low concentration source region 1b and the low concentration drain region 1c of the semiconductor layer 1a, and the high concentration source region 1d and the high concentration drain region 1e of the semiconductor layer 1a. One of the plurality of pixel electrodes 9a which corresponds to the high concentration drain region 1e is connected thereto. In this embodiment, the data lines 6a in particular are formed of a metal film having a low resistance, such as Al or a thin film having a shading property such as an alloy film of metal silicide. Further, a second interlayer insulating film 4, to which the contact holes 5 connecting to the low concentration source region 1d and the contact holes 8 connecting to the high concentration drain region 1e are formed, respectively, is formed on the scanning lines 3a, the gate insulation film 2, and the first interlayer insulation film 12. Further, a third interlayer insulating film 7, to which the contact holes 8 connecting to the high concentration drain region 1e are formed, is formed on the data lines 6a and the second interlayer insulating film 4.

While each pixel switching TFT 30 preferably has the LDD structure as described above, it may have an offset structure in which no impurity ion is implanted into the low concentration source region 1b and the low concentration drain region 1c, or may be arranged a self-alignment type TFT in which impurity ions are implanted in a high concentration using the gate electrodes as a part of the scanning lines 3a as masks so as to form a high concentration source and drain regions in a self-alignment fashion. Further, while this embodiment is arranged as a single gate structure in which only one gate electrode of the pixel switching TFT 30 is disposed between the source region and the drain region, at least two gate electrodes may be disposed therebetween. At this time, the same signal is applied to the respective gate electrodes.

Next, the entire arrangement of the electro-optical device constructed as described above will be described with reference to FIGS. 9 and 10. Note that FIG. 9 is a plan view of the TFT array substrate 10 when it is viewed from the confronting substrate 20 side together with the respective components formed thereon, and FIG. 10 is a sectional view taken along plane H–H' of FIG. 9 for showing the electro-optical device including the confronting substrate 20.

Figure 9:
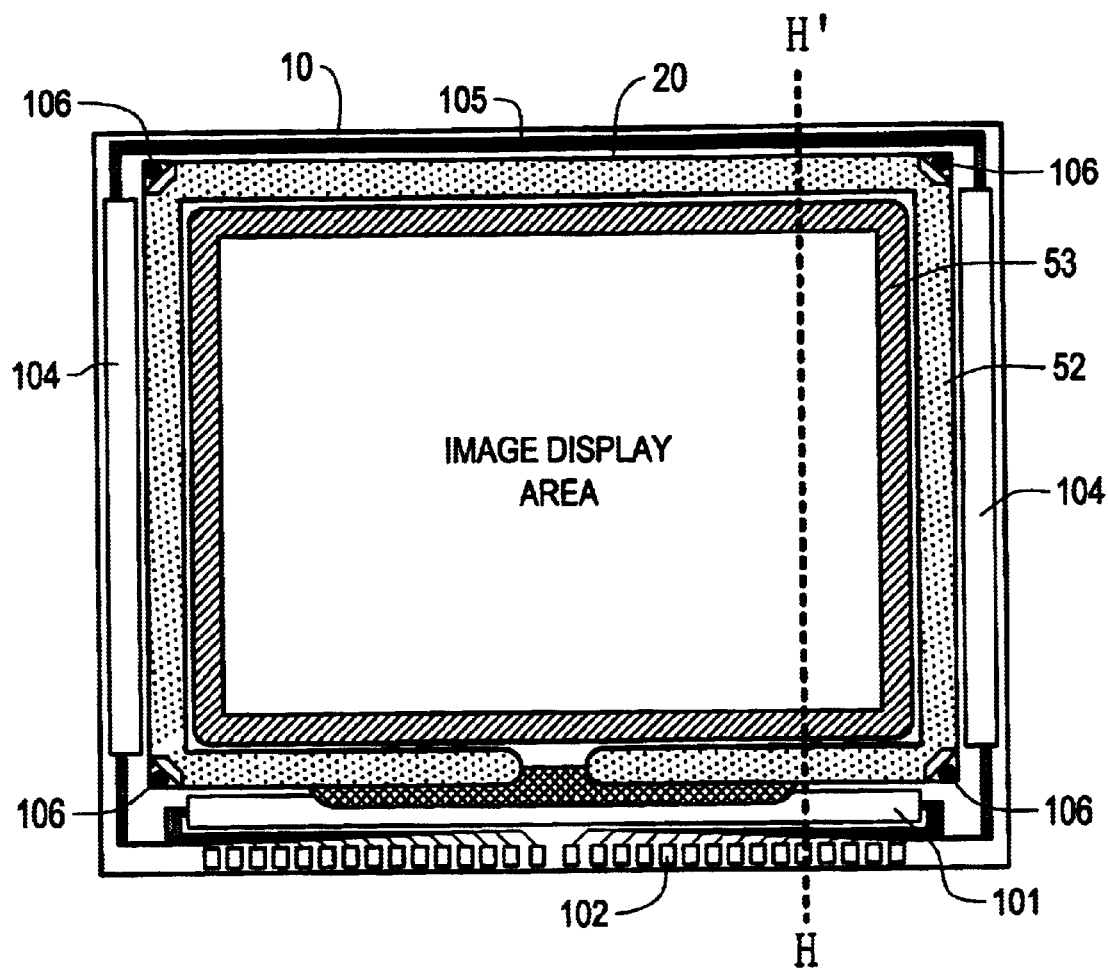
FIG. 9 is a plan view of a TFT array substrate in above-mentioned embodiment of the electro-optical device of the present invention when it is viewed from a confronting substrate side together with the respective components formed on the TFT array substrate.
Figure 10:
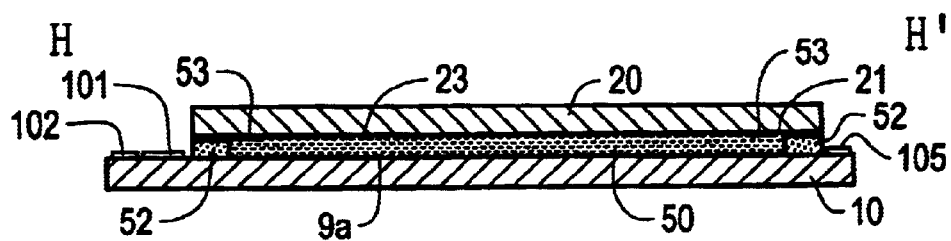
FIG. 10 is a sectional view taken along plane H–H' of FIG. 9.

In FIG. 9, a seal member 52 is disposed on the TFT array substrate 10 along the edge thereof, and a third shading film 53 acting as a frame, which is formed of, for example, a material similar to or different from the second shading films 23, is disposed inward of the seal member 52 in parallel therewith. A data line drive circuit 101 and an external circuit connecting terminals 102 are disposed along one side of the TFT array substrate 10 in a region outside of the seal member 52, and scanning line drive circuits 104 are disposed along two side adjacent to the one side. Further, a plurality of wiring 105 are disposed along the remaining one side of the TFT array substrate 10 to connect the scanning line drive circuits 104 disposed on both the sides of the image display region. Further, an upper and lower portion conductor 106 is disposed to at least one of the corners of the confronting substrate 20 to make electric conduction between the TFT array substrate 10 and the confronting substrate 20. Then, as shown in FIG. 10, the confronting substrate 20, which has substantially the same outline as that of the seal member 52 shown in FIG. 9, is secured to the TFT array substrate 10 by the seal member 52.

In the embodiment of the electro-optical device described above with reference to FIGS. 6 to 10, the data line drive circuit 101 and the scanning line drive circuits 104 may be electrically and mechanically connected to a driving LSI packaged on, for example, a TAB (tape automated bonding substrate) through an anisotropic conductive film disposed at the periphery of the TFT array substrate 10 in place of being disposed on the TFT array substrate 10. Further, an electro-optical device capable of displaying an image of high quality can be realized even if the present invention is applied to any of a TFD active matrix system, a passive matrix drive system, and the like other than a TFT active matrix drive system. Furthermore, in the above-mentioned electro-optical device, a polarizing film, a phase difference film, a polarizing plate, or the like is disposed on the outside surfaces of the confronting substrate 20 and the TFT array substrate 10 in a predetermined direction depending upon operation modes, for example, a TN (twisted nematic) mode, a VA (vertically aligned) mode, and a PDLC (polymer dispersed liquid crystal) mode and on normally white/normally black modes.

The present invention is by no means limited to the above-mentioned embodiments and may be appropriately modified within the range which does not depart from the gist and spirit of the present invention read from the appended claims and the overall specification, and electro-optical devices modified in such a manner also are included in the technical scope of the present invention.

What is claimed is:

1. A substrate device, comprising:

a substrate;

a semiconductor layer formed on said substrate and including a source region, a channel region, and a drain region;

a gate insulation film formed on said semiconductor layer in at least said channel region; and a gate electrode film formed on said gate insulation film, said gate insulation film including a silicon oxide film, and nitrogen atoms exist in at least one of said silicon oxide film and an interface between said silicon oxide film and said semiconductor layer, wherein the nitrogen atoms have a peak concentration in the interface vicinity.

2. The substrate device according to claim 1, said semiconductor layer including any of low temperature polysilicon, high temperature polysilicon, single crystal silicon, and amorphous silicon.

3. The substrate device according to claim 1, said gate insulation film including any of a thermally-oxidized film, a HTO film, a TEOS film, and a plasma-oxidized film.

4. The substrate device according to claim 1, said substrate including any of a glass substrate, a quartz substrate and a plastic substrate.

5. The substrate device according to claim 1, the nitrogen atoms existing in both of said silicon oxide film and said interface, and having a peak of concentration in the vicinity of said interface.

6. The substrate device according to claim 1, a plurality of thin film transistors, each including said semiconductor layer, said gate insulation film, and said gate electrode film, being disposed on said substrate in an array shape.

7. An electro-optical device, comprising:

the substrate device according to claim 1.

* * * * *